United States Patent [19]

Descure et al.

[11] Patent Number: 4,744,057
[45] Date of Patent: May 10, 1988

[54] MULTILINEAR CHARGE TRANSFER ARRAY

[75] Inventors: Pierrick Descure, Biviers; Guy Moiroud, Grenoble; Jean Louis Coutures, St. Egreve; Jean Luc Berger, Grenoble, all of France

[73] Assignee: Thomson-CSF, Paris, France

[21] Appl. No.: 701,948

[22] Filed: Feb. 15, 1985

[30] Foreign Application Priority Data

Feb. 21, 1984 [FR] France .................. 84 02573

[51] Int. Cl.[4] .................................. G11C 13/00
[52] U.S. Cl. ........................... 365/183; 365/106; 365/189; 357/31
[58] Field of Search ............ 365/106, 183, 189, 230; 357/31

[56] References Cited

U.S. PATENT DOCUMENTS

| 3,953,837 | 4/1976 | Cheek, Jr. ............ | 365/183 |
|---|---|---|---|
| 4,085,456 | 4/1978 | Tompsett ............ | 365/183 |
| 4,306,160 | 12/1981 | Hamilton ............ | 365/183 |
| 4,349,743 | 9/1982 | Ohba et al. ............ | 250/578 |
| 4,513,313 | 4/1985 | Kinoshita et al. ............ | 365/183 |

FOREIGN PATENT DOCUMENTS 0038725 10/1981 European Pat. Off. .

OTHER PUBLICATIONS

IEEE Transactions on Electron Devices, vol. ED-27, No. 1, Janvier 1980, pp. 175-188, New York, (U.S.A.); P. Felix et al.: "CCD Readout of . . . ."

Primary Examiner—Terrell W. Fears
Attorney, Agent, or Firm—Roland Plottel

[57] ABSTRACT

A multilinear charge transfer array is provided formed by N lines of P photosensitie detectors. Each photosensitive detector is connected directly by a connection to a demultiplexing and reading system, the signals obtained at the output of the array being fed to a processing device external to the array.

The demultiplexing system comprises a charge transfer shift register with N×P stages, the connections between each detector and the corresponding input of the register being provided so that the detectors of the same rank are connected to contiguous inputs.

22 Claims, 9 Drawing Sheets

FIG_1
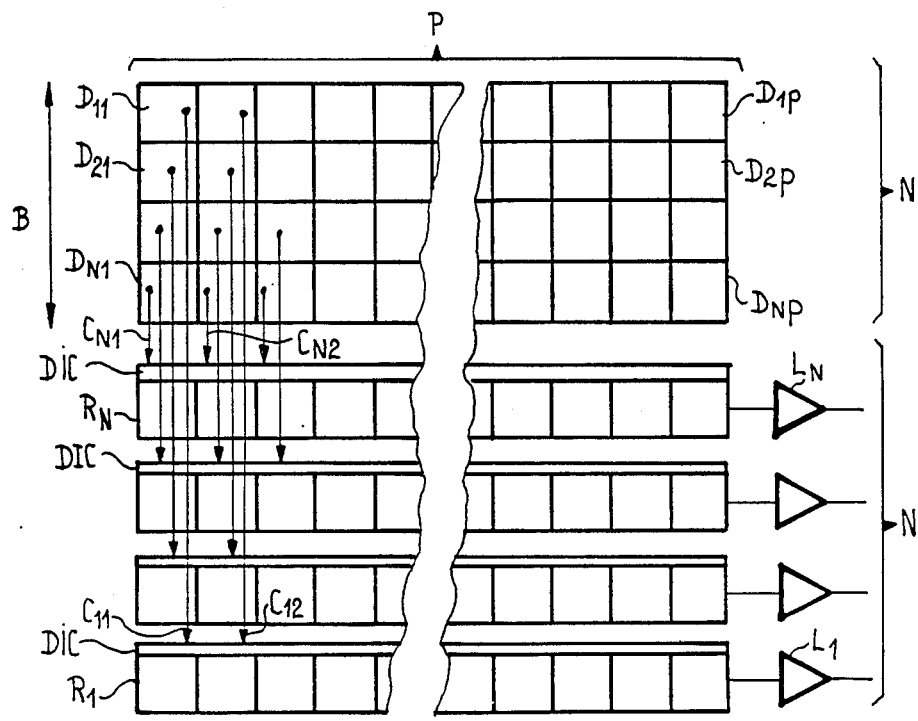
FIG_2
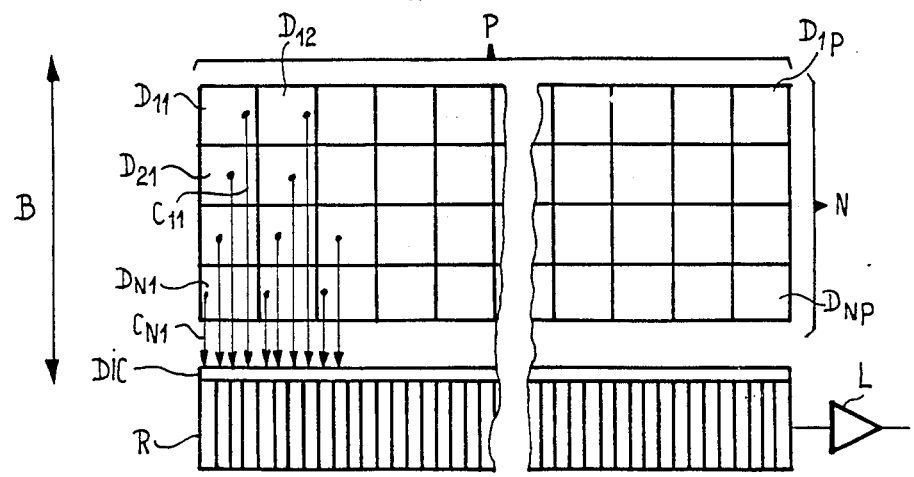

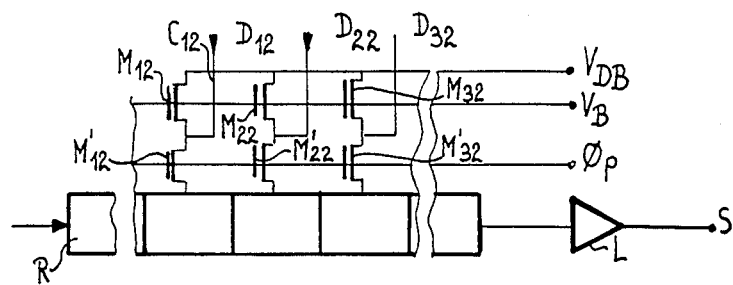
FIG_3
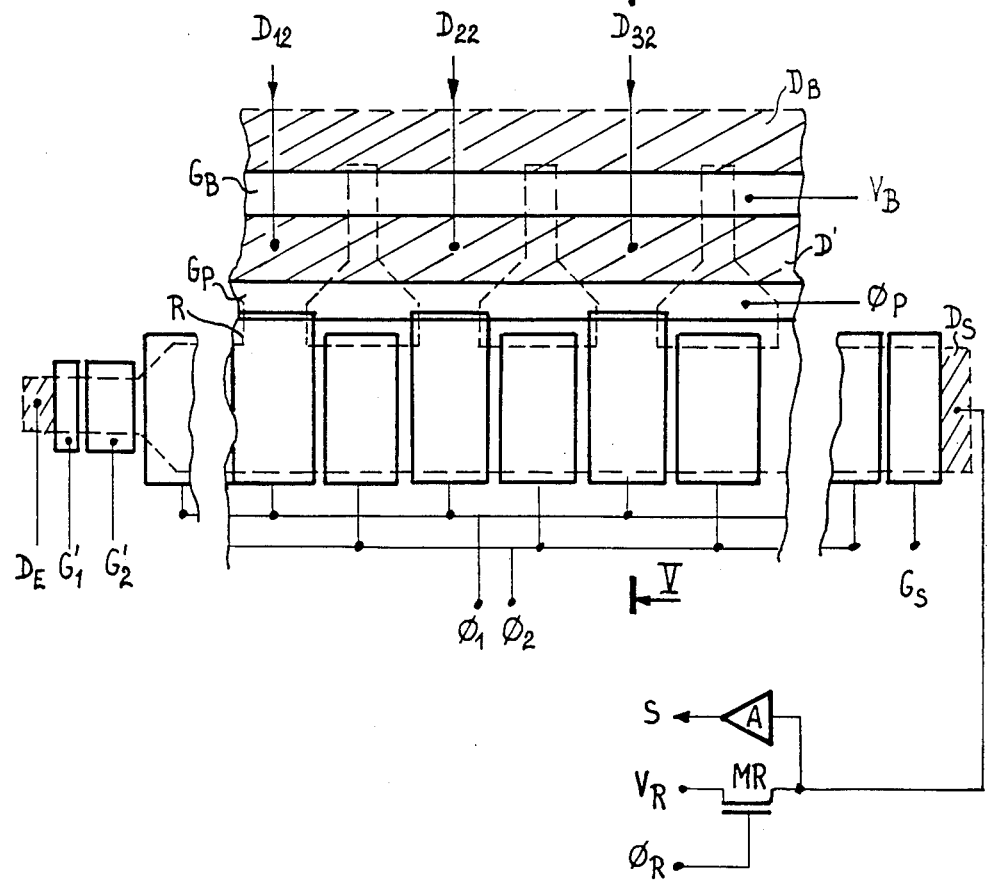
FIG_4

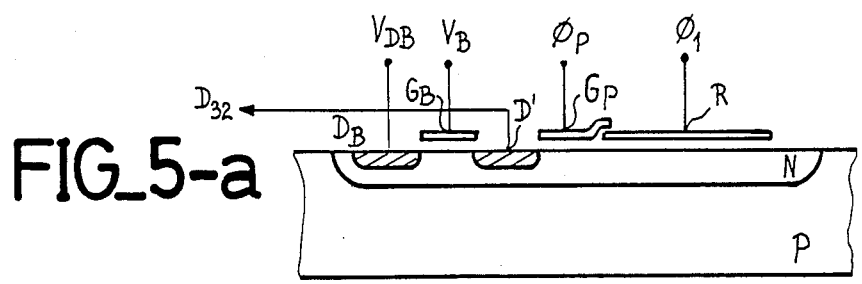
FIG_5-a
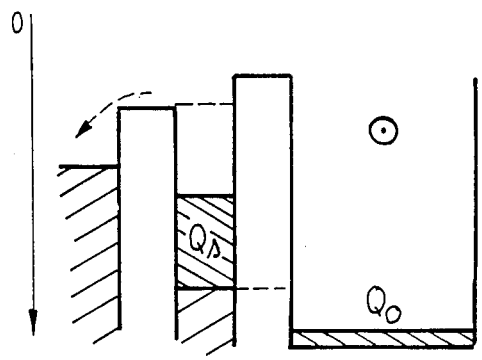
FIG_5-b
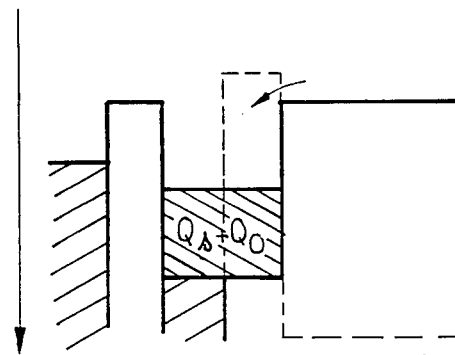
FIG_5-c
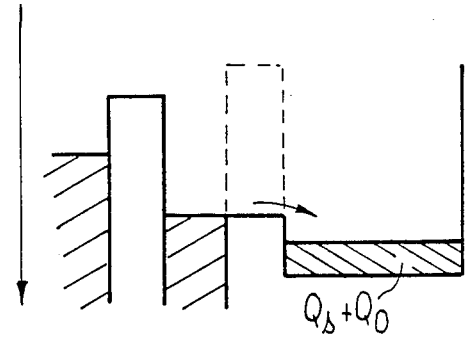
FIG_5-d

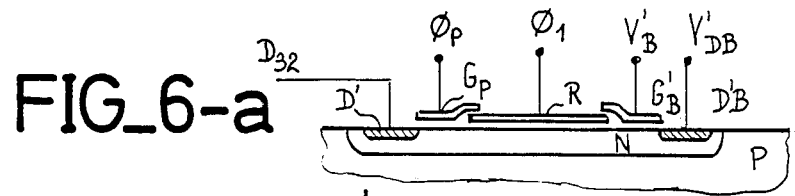
FIG_6-a
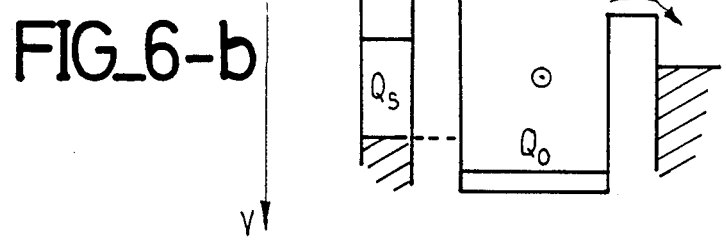
FIG_6-b
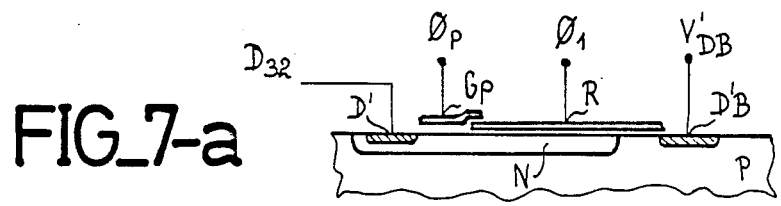
FIG_7-a
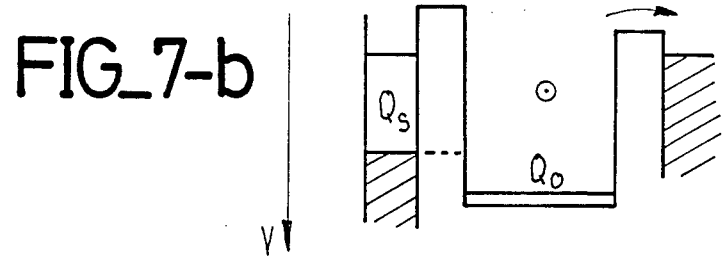
FIG_7-b
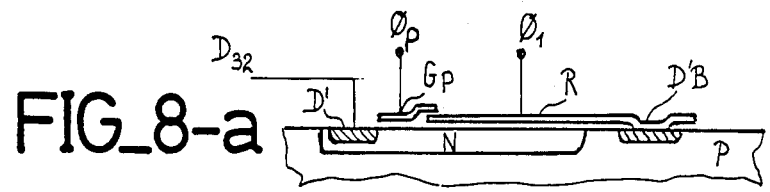
FIG_8-a
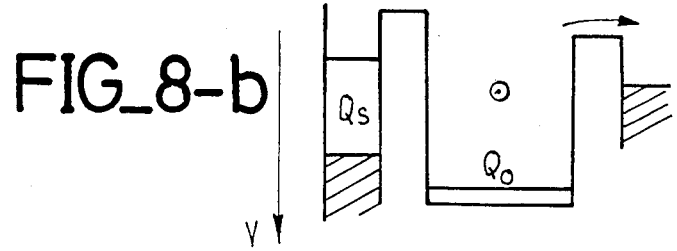
FIG_8-b

FIG_9
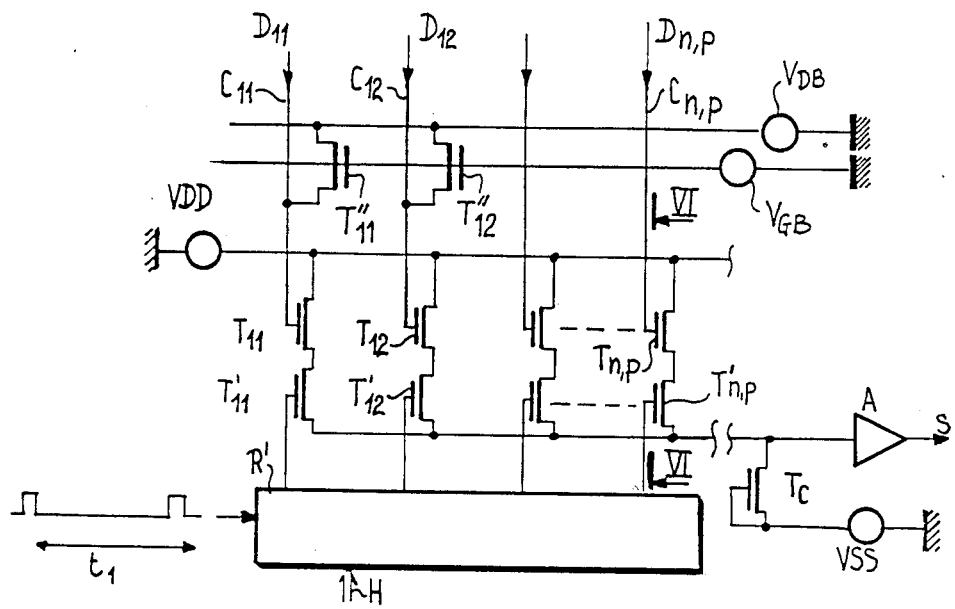
FIG_10-a
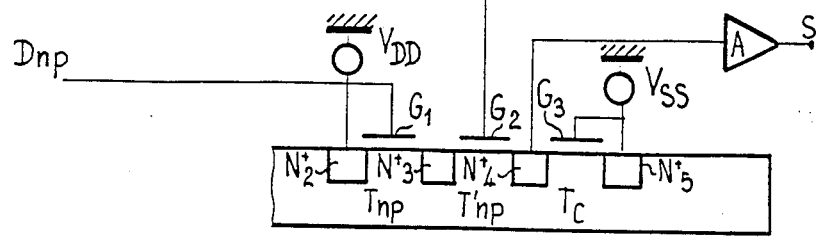
FIG_10-b
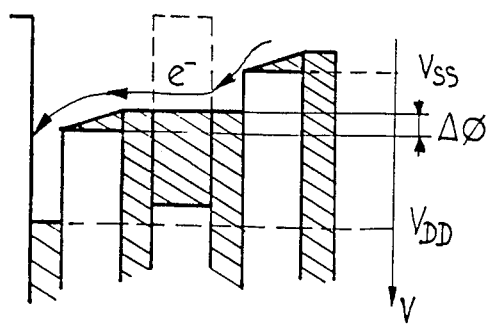

FIG_11
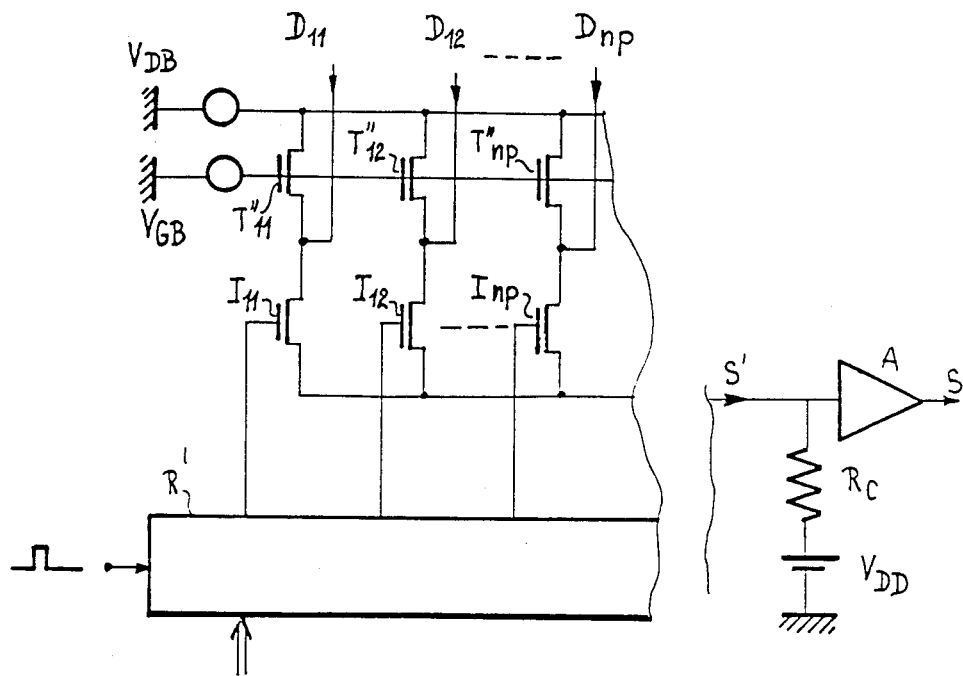

FIG_12
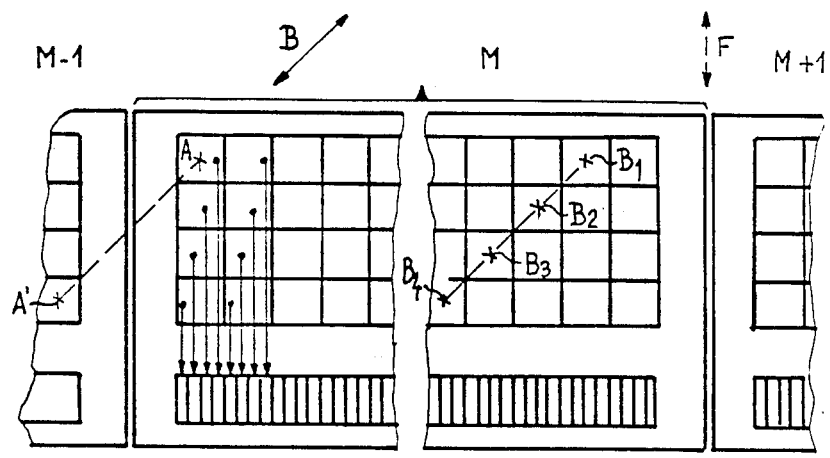
FIG_13
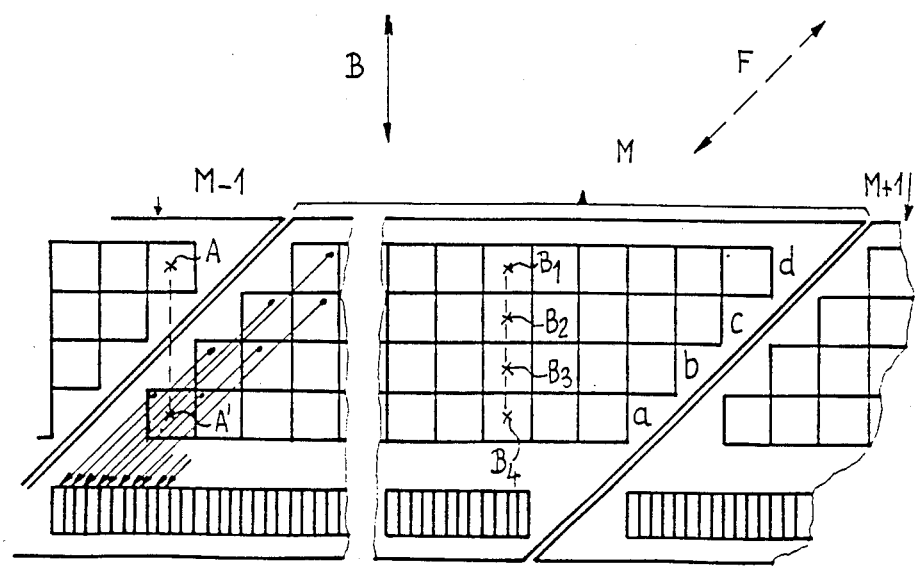

FIG_14
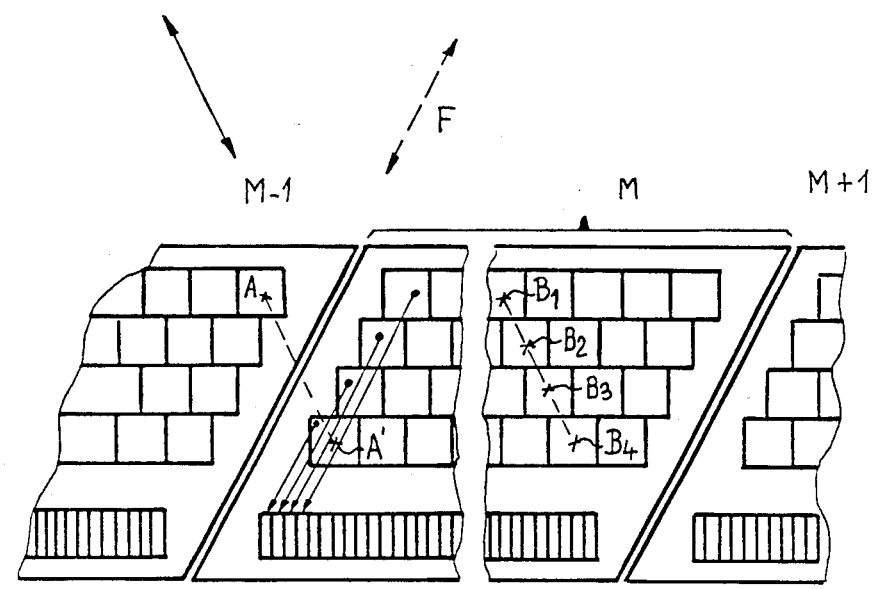
FIG_15
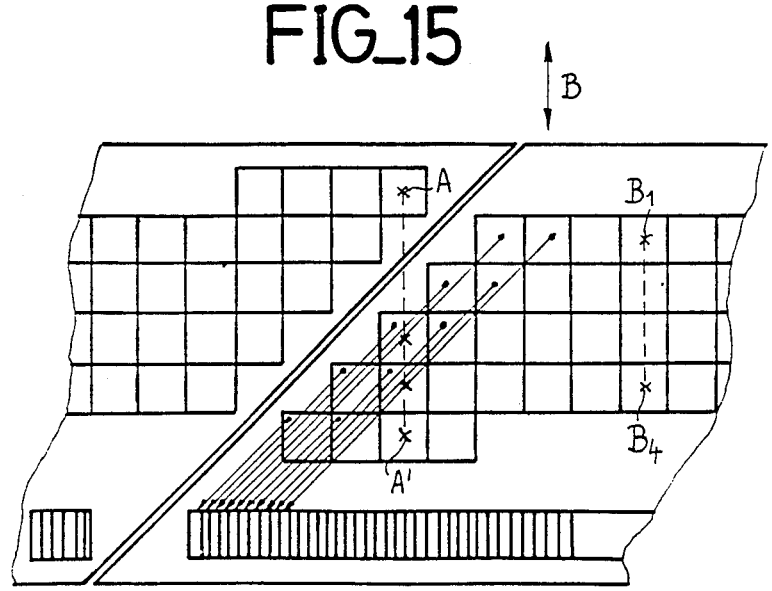

FIG_16
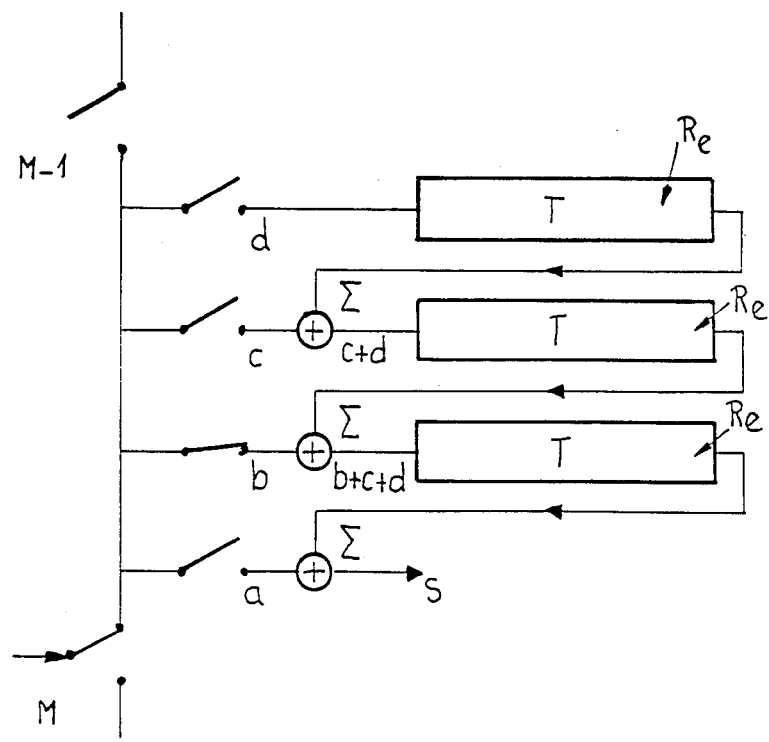

MULTILINEAR CHARGE TRANSFER ARRAY

BACKGROUND OF THE INVENTION

1. Field of the Invention

The present invention relates to multilinear charge transfer array. It relates, more particularly but not exclusively to multilinear charge transfer arrays formed from several elementary arrays and operating in accordance with the principle of integration with charge transfer known as "time delay integration" or TDI.

2. Description of the Prior Art

The multilinear arrays known at present are formed by N lines of P photosensitive detectors such as photodiodes, each line receiving successively the radiation to be detected and by devices for summing, in synchronism with the movement, the information detected on the detectors of the same rank, the whole being integrated on the same substrate. In this case, the integration time is multiplied by N. Now, with the integration time multiplied by N and since the read out noises are added together quadratically, a gain on the signal to noise ratio equal to $\sqrt{N}$ is obtained. This advantage is particularly interesting when these arrays are used for sensing radiological images, for the increase of the signal to noise ratio allows the radiation dose used to be reduced for the same exposure time. In the same way, this type of array may be used for detecting other radiations in particular when it is desired to detect low level radiation.

However, the fact of integrating the TDI function directly on the multilinear array has a number of disadvantages.

The integration of the detectors and the devices providing the TDI function requires substrates of relatively large size and is costly to carry out. Furthermore, the scanning direction is imposed. In addition, during operation, problems of thermo-charge generation are met with, whence the necessity of operating the multilinear array at high frequencies and relatively low temperatures.

Moreover, when it is desired to be able to record large sized images several multilinear arrays are frequently associated so as to form a large sized photosensitive array. In this case, however, a loss of resolution and sensitivity is observed at the transition from one array to the next, which losses are due to the absence of one or more photosensitive detectors at the ends of each line of the elementary arrays. A solution to each problem is to dispose the alignment of the disturbed zones situated at the ends of each of the lines in a direction different from the scanning direction. However, it is not possible to provide such scanning when the TDI devices are integrated with the photosensitive device, for, since the cumulative total is made on photosensitive detectors aligned with the scanning direction, it is then necessary to cumulate information situated on two different elementary arrays.

SUMMARY OF THE INVENTION

The multilinear array of the present invention overcomes this disadvantage, information from two different arrays may be cumulated without any problem.

The present invention provides a multilinear array in which the photodetectors are read individually, and in which time delay integration (TDI) and possibly other treatments to be performed are done outside the photosensitive array.

The structure and/or the scanning of the photosensitive array are such that a plurality of arrays are joinable to an array of larger size, thus minimizing defects due to connections in the images obtained and lost in the information to be detected.

BRIEF DESCRIPTION OF THE DRAWINGS

Other features and advantages of the present invention will be clear from reading the description of different embodiments given by way of example, with reference to the accompanying drawings in which:

FIG. 1 is a schematical view of a first embodiment of a multilinear array with individual reading of the detectors;

FIG. 2 is a schematic view of a second embodiment of a multilinear array with individual reading of the detectors;

FIG. 3 is an enlarged schematical view of the multiplexing and reading system integrated in the array of FIG. 2;

FIG. 4 is a top view of the part shown schematically in FIG. 3;

FIGS. 5a to 5d are respectively a sectional view through V—V of FIG. 4 and representations of the corresponding surface potentials in the substrate on which the multilinear array is integrated;

FIGS. 6a and 6b, 7a and 7b, 8a and 8b are respectively a sectional view identical to that of FIG. 5a of other embodiments of an anti-blooming device and a representation of the corresponding surface potentials in the substrate;

FIG. 9 is a schematical view similar to that of FIG. 3 of a second embodiment of the multiplexing and reading system;

FIGS. 10a and 10b are respectively a sectional view through VI—VI of FIG. 9 and a representation of the corresponding surface potentials;

FIG. 11 is a view similar to the one shown in FIG. 9 of a third embodiment of the demultiplexing and reading system;

FIGS. 12 to 15 show different embodiments of a multilinear array formed from elementary arrays, in accordance with the present invention; and FIG. 16 is a diagram of a device for processing the output signals from the multilinear array.

In the different figures, the same references designate the same elements but, for the sake of clarity the sizes and proportions of the different elements have not been respected.

DESCRIPTION OF THE PREFERRED EMBODIMENTS

The multilinear charge transfer array shown in FIG. 1 is a multilinear array in which, the device for processing the information received is not integrated on the same substrate as the photosensitive zone of said array.

As shown in FIG. 1, the array of the present invention is formed principally by a photosensitive zone comprising N lines of P detectors $D_{11}$, $D_{12}$, ... $D_{1P}$, ... $D_{N1}$, ... $D_{NP}$, and a charge reading and multiplexing system. The photosensitive detectors $D_{11}$ to $D_{NP}$ are formed for example by diodes. Moreover, in the embodiment shown in FIG. 1, the charge reading and multiplexing system is formed principally by N charge transfer shift registers with parallel inputs and a series output, each input of which is connected through a charge injection device DIC and a connection $C_{N1}$, $C_{N2}, \ldots C_{11}, C_{12}$ to one of the corresponding detectors $D_{11}$ to $D_{NP}$ and whose output is connected to a reading stage.

In greater detail, each line of photodetectors is connected to a charge transfer shift register through a connection and a charge injection device. Thus, the Nth line of photodetectors $D_{N1}$ to $D_{NP}$ is connected to the inputs of the shift register $R_N$, and the first line of detectors $D_{11}$ to $D_{1P}$ is connected to the shift register $R_1$. The signals which will be fed to the external processing device are obtained sequentially at the output of the reading stages $L_1$ to $L_N$. When the multilinear array is used for example for sensing radiological images, the array moves in direction B in front of the object or the body which is emitting the radiation to be detected. In this case, the processing device is a device, for summing in synchronism with the movement, the information collected on the detectors of the same rank, that is to say for example on detectors $D_{11}, D_{21}, \ldots D_{N1}$.

According to another embodiment of an array with individual reading out detectors, instead of using N charge transfer shift registers associated with charge injection devices, it is possible to use a single charge transfer shift register comprising $N \times P$ stages as shown in FIG. 2.

In fact, the choice of the number of charge transfer shift registers may be made as a function of the geometrical definition of the photosensitive detectors and of said shift registers, as a function of the number of photosensitive lines and of the conditions chosen for using and processing the signals. If we consider for example the geometrical factors, the number of charge transfer shift registers may be given by the following equation:

$n_o = N \times$ minimum pitch of the registers/pitch of the registers in which: $n_o$ equals the number of registers and N equals number of photosensitive lines. $n_o$ is in fact an integer between 1 and N, these two extreme values being represented respectively in FIG. 2 and in FIG. 1. In the case of $n_o$ registers, the number of stages $p_o$ of each register is chosen so that $p_o \times n = N \times P$.

The photosensitive zone of the multilinear array shown in FIG. 2 is identical to the photosensitive zone of the multilinear array of FIG. 1 already described. As already mentioned, the charge transfer shift register R used as multiplexer in the charge reading and multiplexing system of the multilinear array of FIG. 2 is a register with parallel inputs and a series output comprising $N \times P$ stages. Each input is connected through a charge injection device DIC and a connection $C_{np}$ (with $1 \leq n \leq N$ and $1 \leq p \leq P$) to a photosensitive detector $D_{np}$ of the photosensitive zone. In this case, the connections are made in the following way:

the first photosensitive detectors $D_{N1}$ to $D_{11}$ of the N lines are connected to the N first stages of register R beginning with the diode of line N and so on for the other columns.

The structure and the operation of the charge reading and multiplexing system of the multilinear array of FIG. 2 will now be described with reference to FIGS. 3 to 5.

As shown in FIGS. 3 and 4, each photosensitive detector $D_{12}, D_{22}, D_{32}$, is connected through a connection $C_{12}, C_{22}, C_{32}, \ldots$ to a charge injection device DIC formed by a diode $D'$ and by a gate $G_p$ connected to a potential $\phi_p$ which controls the passage of the charges from diode $D'$ to the input of a corresponding stage of the shift register R. The DIC is in fact formed by a MOS transistor $M'_{12}, M'_{22}, M'_{32}$ whose drain is formed by the diode $D'$, the gate by $G_p$ and the induced source by the input stage of register R.

In the embodiment of FIG. 4, a charge transfer shift register is used in which each stage is formed by a pair of electrodes connected to a control signal $\phi_1$ and by a pair of electrodes connected to a control signal $\phi_2$. Each pair of electrodes is formed by a storage electrode and a transfer electrode. The dissymmetry in the surface potentials required for making the transfer unilateral is achieved, for example, by an extra thickness of oxide or by implantation of impurities of a same type as the substrate. Other types of charge transfer shift registers may be used. Moreover, the shift register R comprises a series charge injection device formed by a diode $D_e$ and gates $G'_1$ and $G'_2$. This charge injection device allows a charge $Q_O$ to be injected forming a charge basis whose purpose will be explained in detail further on.

Furthermore, the shift register R provides multiplexing of the charges integrated in the detectors of the photosensitive zone of the multilinear array and transfers them sequentially to a charge-voltage reading stage of known type formed for example by a gate G and a diode $G_S$ connected to the source of an MOS transistor MR and to the input of an amplifier A outputting the signal S. The drain of the MOS transistor is connected to a constant voltage $V_R$ and its gate to a potential $\phi_R$.

Furthermore, as shown in FIGS. 3 and 4, the multilinear array comprises an anti-blooming device formed by MOS transistors $M_{12}, M_{22}, M_{32}$ whose drain $D_B$ is brought to a bias voltage $V_{DB}$, whose gate $G_B$ is brought to a fixed voltage $V_B$ and whose source is formed by the diode $D'$ injecting charges from the detectors.

The operation of a stage of the above described multiplexing and reading system will now be explained with reference to FIGS. 5a to 5d: as shown in FIG. 5a, the multilinear array of the present invention is formed on a P type silicon substrate. However, it is obvious for a man skilled in the art that equivalent semiconductor substrates such as gallium arsenide or N type silicon substrate may also be used. The multiplexing and reading system formed by the charge injection device, the anti-blooming device and register R is formed on a N type diffusion so as to effect at this level a volume transfer which improves the quality of the transfer and reduces the noise. However, this zone may also be formed directly on the P type substrate. In all cases, the diodes $D_B$ and $D'$ are formed by $N^+$ type diffusions.

The operation of a stage of the multiplexing and reading system is as follows:

During the integration time, the charges $Q_S$ detected by the photosensitive detector $D_{32}$ are stored on diode $D'$. The potential $\phi_p$ of gate $G_p$ is at a low level which prevents the transfer of the charges $Q_S$ to register R. Furthermore, in the case of blooming, that is to say if charge $Q_S$ is too high, the excess charges are removed towards diode $D_B$ over the potential barrier formed by gate $G_B$ brought to a fixed voltage $V_B$ which is chosen so that the channel potential formed under gate $G_B$ is greater than the channel potential formed under gate $G_p$. During this integration time, a charge basis $Q_O$ is injected in series in all the stages of register R as mentioned above. Once the integration is accomplished, the potential $\phi_p$ of gate $G_P$ is brought to a high level whereas the control potential $\phi_1$ of register R is at a low level. Thus, the charge basis $Q_O$ is transferred to diode $D'$ and to gate $G_p$ where it is added to the signal charge $Q_S$, as shown in FIG. 5c. Then, as shown in FIG. 5d, the whole of charges $Q_S$ and $Q_O$ are transferred to the input stage of the charge transfer shift register when $\phi_1$ goes to a high level. Then, as shown with a broken line in FIG. 5d, the potential $\phi_p$ of gate $G_p$ is brought back to a low level and the next integration cycle may begin. As can be clearly seen in FIGS. 5b to 5d, the reference level of diode D' is given by the high level of the potential under the gate $G_P$.

The use of a charge basis improves the transfer of the signal to the charge shift register. It avoids the drag or remanence phenomena of the signal and allows the level and resolution of the output signal to be controlled.

Furthermore, the anti-blooming device for avoiding the distribution of the charge excess of an overilluminated detector to the neighboring detectors or to the multiplexing and reading system also avoids a charge amount from being introduced into the shift register which exceeds the capacity of each of its stages.

This latter function may also be provided by means of an MOS anti-blooming transistor directly associated with each stage of the shift register. Examples of configurations of this MOS transistor associated with each stage of the register are shown in FIGS. 6a, 6b, 7a, 7b and 8a, 8b.

In FIG. 6a and 6b, the MOS anti-blooming transistor is formed by the diode $D'_B$ brought to a bias potential $V'_{DB}$, the gate $G'_B$ brought to a fixed voltage $V'_B$ and the input stage of the register R, these different elements being formed in the N zone. Thus, when the signal charge $Q_S$ transferred is too high with respect to the capacity of each stage of register R, the excess charges are removed over the potential barrier formed under the gate $G'_B$.

In FIGS. 7a and 7b, the N zone only extends under a part of the stages of the CCD register and the MOS anti-blooming transistor is provided by diode $D'_B$ formed by a $N^+$ type diffusion in the P substrate and brought to a bias potential $V'_{DB}$ by the gate portion of register R covering the P substrate and by the gate portion of register R covering the N zone. In this case, the excess charges are removed over the potential barrier formed under the gate portion of register R covering the P substrate and due to the doping difference between the N zone and the P substrate.

In FIGS. 8a and 8b has been shown a variant of FIGS. 7a and 7b in which the diode $D'_B$ is not brought to a bias potential $V'_{DB}$ but is biased by the control potential $\phi_1$ of the shift register.

FIGS. 9 and 10 show another embodiment of the multiplexing and reading system. In this embodiment, the charges integrated by the photosensitive detectors are read directly as a voltage and are multiplexed by using a logic shift register R'.

The conversion system shown comprises voltage reading means formed by MOS transistors $T_{11}, T_{12} \ldots T_{np} \ldots T_{NP}$ connected as a follower stage. The gate $G_1$ of each MOS transistor $T_{np}$ is connected by a connection $C_{11}, C_{12} \ldots C_{np}$ to a photosensitive detector $D_{11}, D_{12} \ldots D_{np} \ldots$ formed by a N type diffusion. The drain of the MOS transistors $T_{NP}$ formed by the N diffusion references $N_2^+$ in FIG. 10a is connected to a bias voltage $V_{DD}$.

Furthermore, the source of the MOS transistor $T_{np}$ referenced $N_3^+$ in FIG. 10a is connected through a MOS transistor $T'_{np}$ playing the role of a switch to a load TC. In the embodiment shown a single load is used for all the follower stages which allows the power to be limited. However, a load could also be used for each follower stage. The load TC is formed by an MOS depletion transistor whose gate $G_3$ is connected to the source formed by the N diffusion referenced $N_5^+$ in FIG. 10a, this source being biased by a DC voltage $V_{SS}$. However, the load could be formed by other types of current sources or by a resistance.

Furthermore, each gate $G_2$ of the MOS switchin transistors $T'_{np}$ is connected to one of the outputs of a logic shift register R' having a series input and parallel outputs. This shift register R' allows one of the MOS transistors $T'_{np}$ to be addressed and enabled, while the other transistors remain disabled. Thus, multiplexing of the different follower stages is provided.

As for the embodiment shown in FIGS. 3 to 5, an anti-blooming device may be provided at the level of each detector. This anti-blooming device is formed in the embodiment shown in FIG. 9 by an MOS transistor $T''_{11}, T''_{12}$ whose drain is connected to a bias voltage $V_{DB}$, gate to the potential $V_{GB}$ and source to the corresponding connection $C_{11}, C_{12}, \ldots$ .

The operation of the system described above will now be explained with reference to FIG. 10b which shows the surface potentials in the substrate during reading of a detector $D_{NP}$.

The charges created in detector $D_{np}$ by radiation are stored in the capacity of the junction formed by this diffusion with the substrate.

The reading of the charges stored in one of said capacities is achieved when the corresponding n.p output of the shift register R' is at logic level 1 so that the gate of the MOS transistor $T'_{np}$ receives a high voltage which enables said transistor, all the gates of the other MOS transistors playing the role of a switch receiving a logic level "0" disabling said transistors. In this case, the MOS transistor $T'_{np}$ behaves like a resistance, the transistor TC, namely the load, is connected to the follower transistor $T_{np}$ and thus a conventional follower stage is obtained, bias voltage $V_{DD}$ being chosen very much greater than the bias voltage $V_{SS}$ as shown in FIG. 10b.

With detector $D_{np}$ connected to gate $G_1$ of the MOS transistor $T_{np}$, a potential is obtained at the level of this gate representing the charge amount integrated in detector $D_{np}$. In fact, since detector $D_{np}$ is connected to gate $G_1$, the potential under this gate is lined up, considering the potential difference due to the insulation, with the potential at the level of the detector.

In addition, as for the case of reading, the transistor $T'_{np}$ is equivalent to a resistance, the potential at the level of the diffusion $N_4^+$ is lined up with the potential at the level of the diffusion $N_3^+$. Now, the potential at the level of the diffusion $N_3^+$ depends on the potential under gate $G_1$, for in a follower stage the potential difference is a constant. Thus a voltage is obtained at the level of diffusion $N_4^+$ representative of the charges stored in detector $D_{np}$. This voltage is fed through the amplifier A to the output terminal S of the multilinear array.

Furthermore, there has been shown with broken lines in FIG. 10b the potential under gate $G_2$ when a logic level "0" is applied to this gate. It can be seen that, in this case, the current symbolized by the arrow $e^-$ cannot flow from the MOS load transistor TC to the MOS follower transistor $T_{np}$.

After reading the information at the n.p input, the "1" logic level of the shift register R' is shifted by a stage under the action of the clock H and then reading of the input n.p +1 is carried out. If the register R' is a series register, a logic level "1" is entered in the register at the beginning of each integration cycle. However, a looped logic shift register could also be used.

In FIG. 11, a third embodiment of the multiplexing and reading system has been shown. In this embodiment, the charges integrated by the photosensitive detectors $D_{11}$, $D_{12}$, ... $D_{np}$ are read by means of the current which passes through the resistance $R_C$ situated at the output.

The demultiplexing and reading system shown comprises MOS transistors $I_{11}$, $I_{12}$, ... $I_{np}$, ... connected as switches, whose drains are connected to a DC voltage $V_{DD}$ through a load resistance $R_C$. The sources of the MOS transistors $I_{11}$, $I_{12}$, ... $I_{np}$, ... are connected through connections $C_{11}$, $C_{12}$, ... $C_{np}$, ... to the detectors $D_{11}$, $D_{12}$, ... $D_{np}$, ... these detectors are also connected, as in the embodiment shown in FIG. 9, to anti-blooming transistors $T''_{11}$, $T''_{12}$, ... $T''_{np}$, ....

Furthermore, the gates of the MOS transistors $I_{11}$, $I_{12}$, ... $I_{np}$, ... are connected to the outputs of a logic shift register R' having a series input and parallel outputs identical to the register R' of the embodiment shown in FIG. 9.

The operation of the above described system is as follows.

The charges created in detector $D_{np}$ by radiation are stored in the capacity formed by the junction $D_{np}$ with the substrate. Reading of the charges stored in this capacity is achieved when the corresponding switch transistor $I_{np}$ is enabled, namely when a logic level "1" is applied to its gate. This reading is obtained by the reproduction at the output by means of amplifier A of the voltage produced by the current from the stored charges through resistance $R_C$ connected to the DC voltage $V_{DD}$.

Once these charges have been shifted, the voltage on detector $D_{np}$ assumes again a value defined by the DC voltage $V_{DD}$. The detector is then isolated through the opening of the switch transistor $I_{np}$, by feeding a logic level "0" to its gate.

It is obvious for a man skilled in the art that the elements A, R and $V_{DD}$ may be provided externally to the multilinear array.

In FIGS. 1 to 11 have been shown different embodiments of an elementary charge transfer multilinear array in which the detectors are read individually. As mentioned in the introduction, it is desirable for certain applications, in particular radiological applications, to be able to combine several elementary arrays so as to obtain an extended charge transfer multilinear array. In the above described elementary array, the detectors are read individually, the processing of the signals obtained, in particular the TDI function, being transferred to outside the device. Thus, it is possible to modify the structure of the elementary array or to provide scanning which is not perpendicular to the line of the photosensitive zone in order to solve the above-mentioned problem resulting from the connection, so as to associate, during processing, detectors situated on different elementary arrays, thus reducing or even removing image connection defects.

Thus, as shown in FIG. 12, the different elementary strips M−1, M, and M+1 are formed by multilinear arrays of the type described with reference to FIG. 2. In this case, the different lines of the photosensitive zone are aligned with each other but, so as to avoid connection defects at the level of the ends of each array, scanning takes place obliquely in direction B. Thus, for processing the detectors provided at the ends, the detector referenced A' in the last line of the array M−1 is associated with the detector referenced A in the first line of array M.

In another embodiment shown in FIG. 13, each line of detectors is offset by one detector with respect to the adjacent lines. Thus, alignment of the missing detectors is achieved in the direction of the oblique arrow F shown with a broken line. In this case, scanning B is provided perpendicularly to the photosensitive lines. Thus, at the ends of each array the detector referenced A in array M−1 is processed with the detector referenced A' in array M. It is obvious for a man skilled in the art that each line of detectors may also be offset by several detectors with respect to the adjacent lines.

According to yet another embodiment shown in FIG. 14, each line of detectors of an elementary array is offset by half a detector with respect to the adjacent lines. In this case, the direction of the missing detectors, namely the edge of the array, is represented by the broken line arrow F and the scanning direction B is oblique, the detector referenced A in array M−1 being processed with the detector referenced A' in array M. It is obvious for a man skilled in the art that each line of detectors may also be offset by a detector portion with respect to the adjacent lines.

However, it should be noted that in the configurations of FIGS. 12 to 14, the number of detectors to be formed for providing the TDI operation remains smaller at the ends of the arrays than elsewhere. In fact, as shown in these different Figures comprising by way of example only four lines, at the ends of the array two or three detectors are associated whereas in the middle of the strip four detectors $B_1$, $B_2$, $B_3$, $B_4$ are associated.

To get over this disadvantage, the configuration shown in FIG. 15 may be adopted. As shown in this Figure, at the two lateral ends of an elementary array one or two additional lines of N detectors are added locally, N corresponding to the number of lines in the array.

A principle will now be explained, with reference to FIGS. 13 and 16, which may be used for providing the TDI function outside the elementary arrays M−1, M, M+1.

If we consider for example the arrangement shown in FIG. 13 in which the elements of the four lines a, b, c, d are referenced by the number of their position along the line:

$a_i$, $b_i$, $c_i$, $d_i$, the elements to be formed having the same index, the sequence at the output of the shift register will be the following: $a_1$, $b_2$, $c_3$, $d_4$, $a_2$, $b_3$, $c_4$, $d_5$, $a_3$, $b_4$, $c_5$, $d_6$, $a_4$, ....

For example, the cumulative total of the signals from the elements of the fourth column will be obtained by effecting the operation:

$$V_4 = d_4(3T) + c_4(2T) + b_4(T) + a_4$$

In which T is the time for displacing the image from one line to the next.

The delays and the above sum may be obtained analogically or digitally according to the principle shown in FIG. 16.

In this Figure, the elements of the different lines to be formed are symbolized by the contactors d, c, b, a. The signal from element d, after passing through a register Re delayed by T, is fed to a summator Σ which receives the signal from element c at its other input. The output c+d after passing through a register Re giving it a delay T is fed to a summator Σ whose other input receives the signal from element b. The sum b+c+d after being delayed by a time T is fed to a summator Σ whose other input receives the signal from element a and the output S gives the signal formed.

On the other hand, the output of an elementary array may be connected to the next array by a switch so as to form elements present on different arrays.

It is obvious that FIG. 16 only shows one method of providing the TDI function.

The embodiments described above have been given solely by way of illustration and may be modified in numerous ways. In particular, in the case of FIG. 1, the charge transfer shift registers may be positioned on each side of the photosensitive zone or else laterally or even possibly folded back on themselves.

Furthermore, a multilinear array may be designed in which only a certain number of detectors provided at the ends of each line are read individually using a structure such as the one described above, the TDI function being integrated in the strip for the central detectors.

We claim:

1. A multilinear charge transfer array formed by N lines of P photosensitive detectors, wherein each photosensitive detector is connected directly by a connection to an input of a multiplexing and reading system comprising N×P inputs and an output, the signals obtained at the output of the array being fed to a processing device outside the strip, and wherein, when each line of the array receives successively the radiation to be detected due to a scanning, said scanning having a direction B which forms an angle with respect to a line formed by detectors having same ranks in successive lines.

2. The multilinear array as claimed in claim 1, wherein each line of detectors is staggered by one or more detectors with respect to adjacent lines, and the direction of scanning being perpendicular to the line.

3. The multilinear array as claimed in claim 1, wherein each line of detectors is staggered by a half or part of a detector with respect to the adjacent lines.

4. The multilinear array as claimed in claim 1, wherein the lines of the detectors are aligned, and the scanning direction being non-perpendicular to the line.

5. The multilinear array as claimed in claim 1, wherein the array is provided with two lateral ends having at least one additional line of N detectors.

6. The multilinear array as claimed in claim 1, wherein said multiplexing and reading system comprises at least one multiplexing device with parallel inputs and a series output.

7. The multilinear array as claimed in claim 1, wherein said multiplexing and reading system is formed by $n_o$ charge transfer shift registers with parallel inputs and a series output comprising $p_o$ stages, $n_o$ being an integer chosen so that $n_o$ equals N×minimum pitch of the registers/pitch of the registers and $p_o$ being chosen so that $p_o \times n_o = N \times P$ each connection from a detector being connected to an input of one of the shift registers through a charge injection device and the outputs of the registers being each connected to the external processing device through a charge-voltage reading stage.

8. The multilinear array as claimed in claim 7, wherein n equals 1, and the multiplexing system comprises a charge transfer shift register with N×P stages, the connections between each detector and the corresponding input of the register being formed so that the detectors of the same rank are connected to contiguous inputs.

9. The multilinear array as claimed in claim 7, wherein n equals N, and the multiplexing system comprises N charge transfer shift registers with P stages, each line of photodetectors being connected to a shift register.

10. The multilinear array as claimed in claim 7, wherein each stage of the shift registers is associated with an anti-blooming device.

11. The multilinear array as claimed in claim 7, wherein each charge injection device is formed by
    charge injection diode connected to a detector by a connection, and
    an injection gate which controls the passage of the charges towards the input of a stage of the charge transfer shift register.

12. The multilinear array as claimed in claim 11, wherein said charge injection device is associated with anti-blooming device.

13. The multilinear array as claimed in claim 8, wherein said anti-blooming device is formed by a diode separated from the injection diode by a screen gate brought to a fixed voltage.

14. The multilinear array as claimed in claim 7, further comprising means for superimposing on the signal charge from the detector a charge basis for controlling or improving the level and/or the resolution of the output signal.

15. The multilinear array as claimed in claim 14, wherein said means for superimposing a charge basis on the signal charge is formed by a charge injection stage injecting the charge basis in series into the charge transfer register or registers.

16. The multilinear array as claimed in claim 1, wherein said demultiplexing and reading system is formed by voltage reading means each connected to a connection from a detector and at least one addressing means for sequentially addressing one of the reading means so as to read each detector successively.

17. The multilinear array as claimed in claim 16, wherein said voltage reading means is formed by a follower stage whose input is connected by a connection to a detector.

18. The multilinear array as claimed in claim 16, wherein said addressing means is formed by a logic shift register with parallel outputs, one output of which is connected through a switch to a reading means for cyclically enabling the reading means during a logic level "1".

19. The multilinear array as claimed in claim 16, wherein each of said voltage reading means is formed by a MOS transistor whose source is connected to the corresponding detector, gate to the addressing means formed by a logic shift register and drain to a load resistance connected to a DC voltage.

20. The multilinear array as claimed in claim 1, further comprising a blooming device associated with each detector.

21. The multilinear array as claimed in claim 1, wherein, when each line of the array receives successively the radiation to be detected, the external processing device is a device providing the in-phase summation of the information collected on the detectors occupying the same position with respect to the scanning direction in the different lines.

22. The multilinear array as claimed in claim 21, wherein said device ensuring the in-phase summation of the information collected on the detectors is an analog or digital device.

* * * * *